(12) United States Patent
Yang

(10) Patent No.: US 8,503,232 B2
(45) Date of Patent: Aug. 6, 2013

(54) SEMICONDUCTOR MEMORY DEVICE AND PROGRAMMING METHOD THEREOF

(75) Inventor: Chang Won Yang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 443 days.

(21) Appl. No.: 12/827,077

(22) Filed: Jun. 30, 2010

(65) Prior Publication Data

US 2010/0329005 A1 Dec. 30, 2010

(30) Foreign Application Priority Data

Jun. 30, 2009 (KR) ........................ 10-2009-0059153

(51) Int. Cl.
*G11C 11/34* (2006.01)
*G11C 16/04* (2006.01)

(52) U.S. Cl.
USPC ............ 365/185.03; 365/185.18; 365/185.22; 365/185.25

(58) Field of Classification Search
USPC .............. 365/185.03, 185.18, 185.22, 185.24
See application file for complete search history.

(56) References Cited

U.S. PATENT DOCUMENTS

| 7,170,793 B2 * | 1/2007 | Guterman ................ 365/185.28 |
| 7,715,231 B2 * | 5/2010 | Kim et al. ................ 365/185.03 |
| 7,808,819 B2 * | 10/2010 | Murin et al. ............. 365/185.03 |
| 7,898,876 B2 * | 3/2011 | Yang et al. ................ 365/189.05 |
| 2007/0030732 A1 * | 2/2007 | Micheloni et al. ....... 365/185.03 |

FOREIGN PATENT DOCUMENTS

| KR | 1020080029758 A | 4/2008 |
| KR | 1020090035871 A | 4/2009 |
| KR | 1020090048763 A | 5/2009 |

* cited by examiner

*Primary Examiner* — Toan Le
(74) *Attorney, Agent, or Firm* — William Park & Associates Patent Ltd.

(57) ABSTRACT

A programming method comprised of: classifying memory cells to be programmed into first, second and third levels; applying a program inhibition voltage to an unselected bit line, applying a ground voltage to bit lines, which are coupled with memory cells that are to be programmed into the third level, among selected bit lines, and applying a first voltage, which is lower than the program inhibition voltage but higher than a ground voltage, to bit lines coupled with memory cells that are to be programmed into the second level, and applying a second voltage, which is lower than the program inhibition voltage but higher than the first voltage, to bit line coupled with memory cells that are to be programmed into the first level; and supplying a program voltage, which gradually increases, to a selected word line coupled with the memory cells while applying the voltages to the bit lines.

10 Claims, 5 Drawing Sheets

SEMICONDUCTOR MEMORY DEVICE AND PROGRAMMING METHOD THEREOF

CROSS-REFERENCE TO RELATED APPLICATIONS

The present application claims priority under 35 U.S.C. 119(a) to Korean Application No. 10-2009-0059153, filed on Jun. 30, 2009, in the Korean Intellectual Property Office, which is incorporated by reference in its entirety as set forth in full.

BACKGROUND

1. Technical Field

Embodiments of the present disclosure relate generally to programming semiconductor memory devices. In particular, the present disclosure is concerned with a programming method for shortening a program time, and a semiconductor memory device therefor.

2. Related Art

Among semiconductor memory devices, nonvolatile memory devices are operable to store data and maintain the stored data therein even without a power supply. Increasingly used in portable memory apparatuses in recent years, nonvolatile memory devices are required to be lighter weight and to have larger data storage capacities.

Nonvolatile memory devices may operate in two states of threshold voltages where the two states respectively correspond to erased and programmed states. More particularly, memory cells within the nonvolatile memory device may be classified as being either erased, or in a programmed state, by the threshold voltages present in the memory cell. That is, the erased and programmed states may correspond to one of the two threshold voltages which further correspond to a logical "on" and "off" which may also be referred to as a logical "1" or "0," or vice versa depending on the specific device implementation A nonvolatile memory device memory cell operating in this manner is called a "single level cell" (SLC). However, multi-level or multi-bit nonvolatile memory devices have been proposed to meet the need for larger data storage capacity devices. In a multi-bit nonvolatile memory device, threshold voltages of memory cells are grouped in plural states, that is, more than two. A memory cell of a multi-bit nonvolatile memory device is therefore called a "multi-level cell" (MLC). An exemplary procedure of programming an MLC is as follows.

FIG. 1 graphically shows program voltage variations over time by a general programming operation.

A case of an MLC having three or more threshold voltage states will be described as an example. For instance, memory cells operating with four threshold voltage distributions may be conditioned in an erased state, a first programmed state, a second programmed state and a third programmed state. A programming operation referred to as an incremental step pulse programming (ISPP) mode is conducted by gradually increasing a program voltage by a predetermined rate of step pulse, which is useful to restrain extensions of threshold voltage distributions.

However, the ISPP programming operation takes a long program time to condition memory cells into the first through third programmed states. The program time is long because the memory cells are processed in sequence from the first programmed state to the third programmed state. Further contributing to the length of programming time required, each program stage for each programmed state requires a verifying step that applys a program-verify voltage Vf, subsequent to a program voltage Vpgm, to a selected word line. The program time therefore becomes longer in relation to the number of MLC bits. For example, in reference to FIG. 1, in the time segment where the first, second and third program periods (1st, 2nd and 3rd PGM periods) overlap with each other, the third program-verify voltage Vf is sequentially applied to all of the memory cells. Thus, the verification increases the program time by the number of the MLC bits.

SUMMARY

Accordingly, the presently disclosed embodiments are directed to stably programming memory cells into programmed states independent from each other by adjusting voltage levels to be supplied to bit lines while applying a program voltage, which corresponds to the highest programmed state, to a selected word line.

In an embodiment, a programming method may be comprised of: classifying memory cells to be programmed into first, second and third levels; applying a program inhibition voltage to an unselected bit line, applying a ground voltage to bit lines, which are coupled with memory cells that are to be programmed into the third level, among selected bit lines, and applying a first voltage, which is lower than the program inhibition voltage but higher than a ground voltage, to bit lines coupled with memory cells that are to be programmed into the second level, and applying a second voltage, which is lower than the program inhibition voltage but higher than the first voltage, to bit line coupled with memory cells that are to be programmed into the first level; and supplying a program voltage, which gradually increases, to a selected word line coupled with the memory cells while applying the voltages to the bit lines.

The first level may be higher than a threshold voltage of an erased voltage, the second level may be higher than the first voltage, and the third level may be higher than the second voltage.

Classifying the memory cells to be programmed into the first, second and third levels may be comprised of: inputting program data into page buffers coupled with the bit lines and classifying the levels to program the memory cells in accordance with the input data.

Transferring a voltage to selected bit lines from a sensing node may be comprised of applying a program voltage to a selected word line.

A program pass voltage may be applied to the rest word lines but the selected word line.

The program voltage may be supplied in the same level even if another word line is selected.

In another embodiment, a programming method may be comprised of: classifying memory cells, which are to be programmed, in accordance with a program level; providing a voltage, which is inversely proportional to the program level, to bit lines of the memory cells that are to be programmed; and supplying a program voltage into the memory cells, which are to be programmed, while providing the voltage to the bit lines.

The memory cells to be programmed may be classified by inputting program data into page buffers each coupled with the bit lines, wherein the voltage inversely proportional to the program level may be provided to the bit lines in accordance with the program data.

In accordance with the embodiments, a semiconductor memory device may be comprised of: a plurality of strings each including a plurality of memory cells; and page buffers coupled with the strings respectively through bit lines and configured to providing bit line voltages of various levels into the bit lines in accordance with program level of memory cells that are to be programmed.

The page buffer may include: a bit line selector configured to couple a sensing node with a selected one of the bit lines; a precharge circuit configured to transfer a precharge voltage to the sensing node; a voltage controller configured to provide a voltage of various levels to the sensing node; and a latch circuit coupled with the sensing node and configured to receive data that is to be programmed.

The voltage controller may include: fifth and sixth switches serially coupled between a terminal of a power source voltage and the sensing node; and a seventh switch coupled between a gate line of the sixth switch and the sensing node.

The seventh switch may operate in compliance with a first control signal that is generated from a voltage generator.

A voltage applied to the sensing node may be dependent on a voltage level of the first control signal. And the fifth, sixth and seventh switches may be formed using NMOS transistors or using any appropriate technology.

The embodiments herein disclosed are advantageous for shortening a program time by reducing the whole span of plural programming periods, offering a higher program rate that enables a semiconductor memory device to operate at a higher frequency.

A further understanding of the nature and advantages of the various embodiments disclosed herein may be realized by reference to the remaining portions of the specification and the attached drawings.

BRIEF DESCRIPTION OF THE DRAWINGS

The presently disclosed embodiments are illustrated by way of examples, and not by way of limitation, in the figures of the accompanying drawings and in which like reference numbers refer to similar elements and in which.

DESCRIPTION OF EMBODIMENTS

Hereinafter, various exemplary embodiments will now be described more fully with reference to the accompanying drawings in which some exemplary embodiments are shown. However, specific structural and functional details disclosed herein are merely representative for purposes of describing exemplary embodiments of the present disclosure.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/ or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosed embodiments. As used herein, the term "and/or" includes any and all combinations of one or more of the associated listed items. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In order to more specifically describe exemplary embodiments, various aspects will be hereinafter described in detail with reference to the attached drawings.

Figure 1:
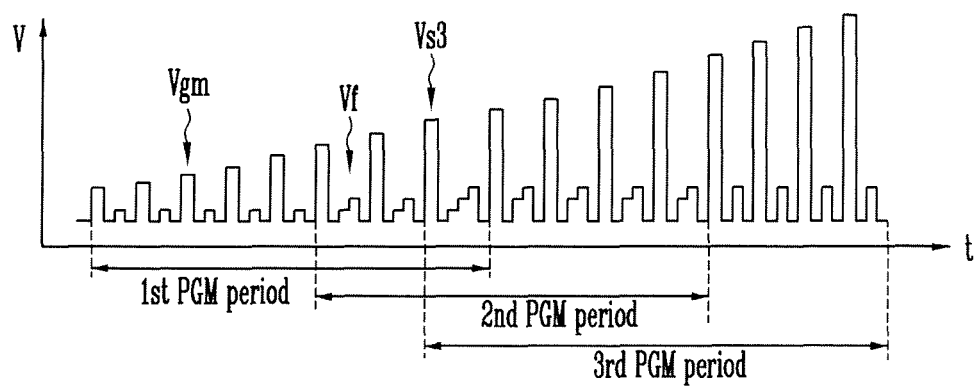
FIG. 1 is a graphic diagram showing a general programming operation.
Figure 2:
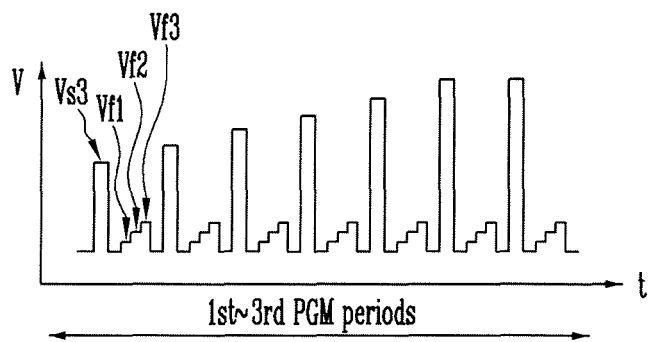
FIG. 2 is a graphic diagram showing a programming operation according to an embodiment of the present disclosure.
Figure 3:
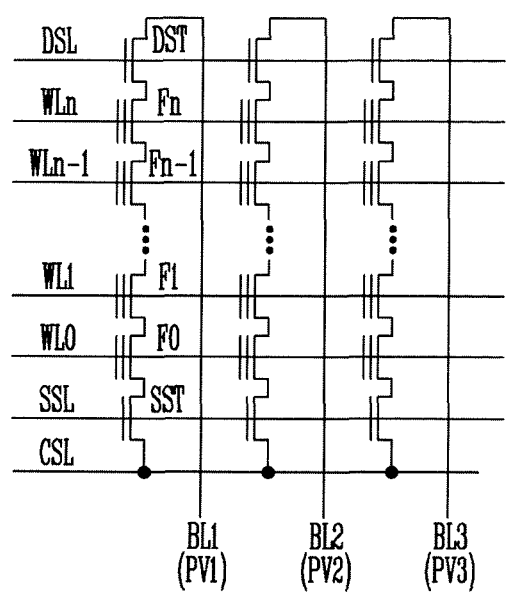
FIG. 3 is a circuit diagram illustrating a programming operation according to embodiments of the present disclosure.

FIG. 2 shows graphically a timing pattern of a programming operation according to an embodiment and FIG. 3 illustrates a circuit for conducting the programming operation according to an embodiment.

The programming operation will be now detailed in conjunction with FIGS. 2 and 3.

A programming operation for a semiconductor memory device can be carried out in the ISPP mode so as to restrain extensions of threshold voltage distributions. The ISPP programming operation is conducted by applying a program voltage to a selected word line to program a selected memory cell and then verifying whether a threshold voltage of the selected memory cell has arrived at a target voltage level. Unless the selected memory cell voltage is detected as having passed by the verifying step, the program voltage is reset by increasing its level by a predetermined increment of step pulse and then applying it to the selected memory cell to correct the memory cell programming.

According to an embodiment, in an MLC programming operation, a program voltage applied to a selected word line is designed to condition a selected memory cell in the highest threshold voltage state.

The programming operation of the embodiments is conducted in a memory cell array, for example, a memory cell array as shown in FIG. 3.

The example memory cell array of the nonvolatile memory device is composed of a plurality of strings. Each string includes a drain selection transistor DST, memory cells F0 through Fn, and a source selection transistor SST, all of which are coupled in series. Drains of the drain selection transistors DST belonging to different strings are each coupled with corresponding bit lines BL1 through BL3. Sources of the source selection transistors SST belonging to different strings are coupled with a common source line CSL. The memory cells forming rows of the memory cell array and belonging to different strings are coupled with word lines WL0 through WLn respectively such that each word line is coupled to one row of the memory cell array.

In an example programming operation of the embodiments, MLCs having four states of threshold voltages can be classified into an erased state, a first state, a second state and a third state in accordance with program voltage levels. The first state corresponds to a condition in which a memory cell is programmed at the lowest voltage level. The third state corresponds to a condition in which a memory cell is programmed at the highest voltage level. A selected memory cell can be programmed into the first state through a first program period (1st PGM period), programmed into the second state through a second program period (2nd PGM period), and then programmed into the third state through a third program period (3rd PGM period), in sequence.

During this, first through third programming operations are conducted at the same time, for which a third program voltage corresponding to the third program period is applied to a selected word line (e.g., WL0 of FIG. 3) coupled to a selected memory cell (e.g., F0) and different bit line voltages are applied to different bit lines (e.g., BL1 through BL3).

As an example, hereinafter will be described the case of programming a memory cell, which is coupled with the first bit line BL1, among the memory cells F0 commonly coupled with the first word line WL0, into the first state (or first level) PV1, programming a memory cell, which is coupled with the second bit line BL2, into the second state (or second level) PV2, and programming a memory cell, which is coupled with the third bit line BL3, into the third state (or third level) PV3.

The third program voltage $V_{s3}$, as a program start voltage, is applied to a selected word line WL0. The third program voltage $V_{s3}$ is a voltage that is applied to the selected word line so as to force a selected memory cell set into the third state PV3 under the condition that a third bit-line voltage (e.g., 0V) is being applied to a bit line. During this, a memory cell, which is coupled with the first word line WL1 and to be programmed into the first state PV1, is supplied with a program voltage higher than a voltage that is used for the first state PV1, so that a first bit line of positive level is applied to a bit line coupled to the memory cell in order to reduce a voltage gap between the first word line and a well containing the memory cell. In the meantime, a second bit-line voltage, which is lower than a first bit-line voltage but higher than a third bit-line voltage, is applied to the second bit line BL2 coupled with a memory cell to be programmed into the second state PV2. Here, the second bit-line voltage may be set on ½ of the first bit-line voltage and the third bit-line voltage may be set on the level of the ground voltage (e.g., 0V).

As aforementioned, by controlling voltages that are applied to bit lines coupled with different strings while applying a voltage to a word line in constant level, the selected memory cells belonging to their respective strings can be programmed to have different threshold voltage states due to different voltage gaps between gates of the memory cells and wells. Especially, in the ISPP programming mode, it may be preferred to apply program-verify voltages corresponding respectively to verifying steps between the program periods.

There are several ways of applying different bit-line voltages to the bit lines (BL1 through BL3) in correspondence with the programming operation. One of them may be exemplified as follows.

Figure 4:
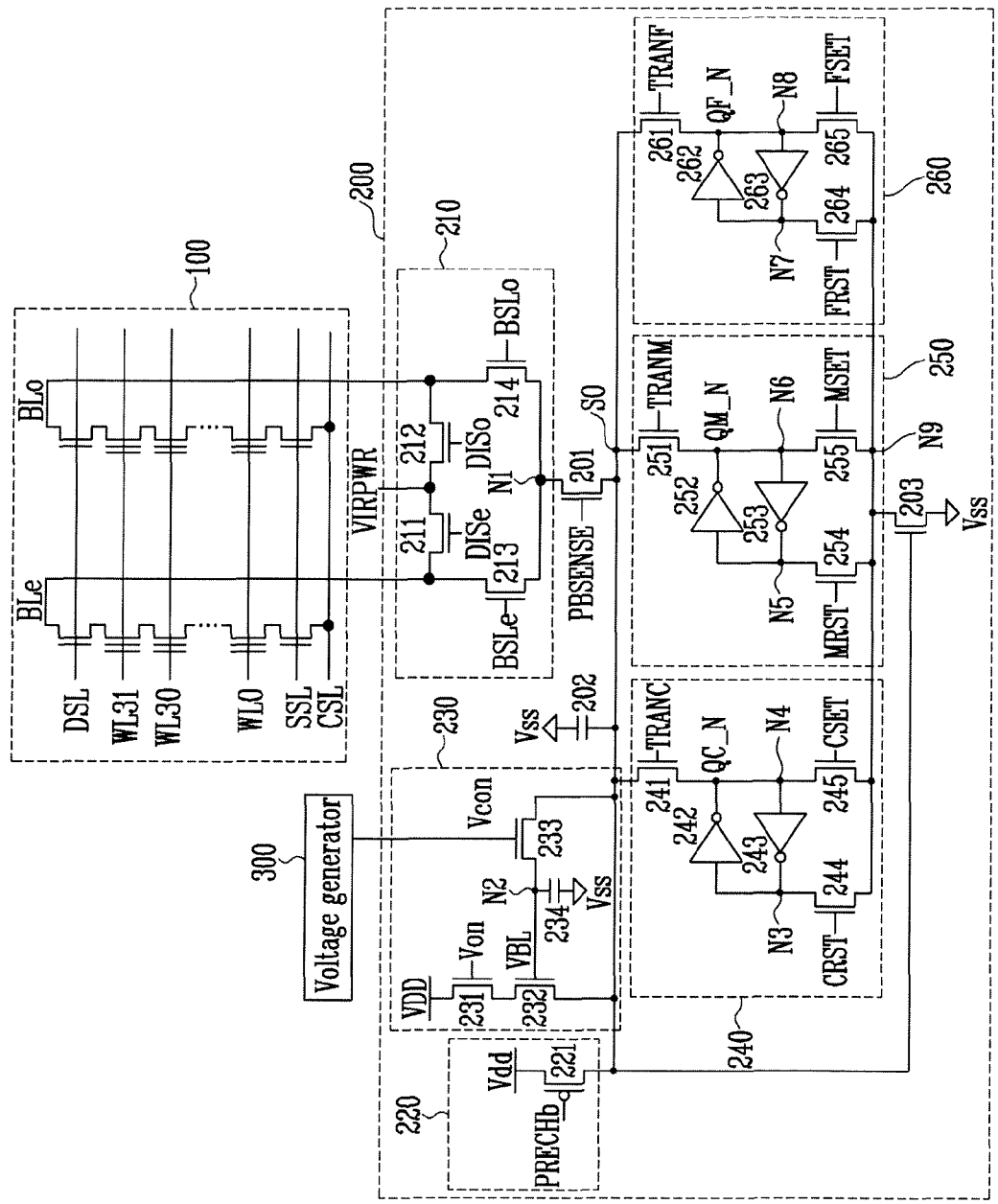
FIG. 4 is a circuit diagram illustrating an organization for conducting the programming operation according to embodiments of the present disclosure.

FIG. 4 illustrates a circuit organization of a semiconductor memory device for conducting the programming operation according to the disclosed embodiments.

This semiconductor memory device shown in FIG. 4 is comprised of a memory cell array 100, a page buffer 200 and a voltage generator 300.

The memory cell array 100 includes a plurality of memory cells that store data and are coupled with bit lines BLe and BLo, a drain selection line DSL, word lines WL0 through WL31 (embodied in 32 word lines), a source selection line SSL and a common source line CSL. Here, a unit of memory cells coupled with the same word line is called a "page".

The page buffer 200 is electrically connected to the memory cell array through the bit lines BLe and BLo. The page buffer 200 is organized by including a bit line selector 210 to select one of the bit lines BLe and BLo, a precharge circuit 220, a voltage controller 230 to adjust a voltage level applied to the bit line BLe or BLo, and latch circuits 240, 250 and 260.

The bit line selector 210 includes first and second switches 211 and 212 which are coupled in series between the even bit line BLe and the odd bit line BLo. The first switch 211 operates in response to an even selection signal DISe and the second switch 212 operates in response to an odd selection signal DISo. A virtual voltage VIRPWR is applied to a node between the first and second switches 211 and 212. In addition, a third switch 213 is interposed between the even bit line BLe and a first node N1 and a fourth switch 214 is interposed between the odd bit line BLo and the first node N1. The third switch 213 operates in response to an even bit-line signal BSLe and the fourth switch 214 operates in response to an odd bit-line signal BSLo. The first through fourth switches 211 through 214 may be formed by NMOS transistors or using any other suitable technology.

The precharge circuit 220 includes a precharge switch 221 coupled between a power source voltage Vdd and a sensing node S0. The precharge switch 221 may be formed using a PMOS transistor, or using any other suitable technology, operating in response to a precharge signal PRECHb.

The voltage controller 230 is provided to adjust a voltage level applied to the bit line BLe or BLo in the programming operation, and includes fifth and sixth switches 231 and 232 which are serially coupled between a terminal of the power source voltage Vdd and the sensing node S0. The voltage controller 230 also includes a seventh switch 233 interposed between a gate of the sixth switch 232 and the sensing node S0. The fifth switch 231 operates in response to a second control signal Von and the seventh switch 233 operates in response to a first control signal Vcon. If the seventh switch 233 is turned on, a voltage control line VBL coupled with a gate of the sixth switch 232 is electrically connected to the sensing node S0. The sixth switch 232 operates in compliance with a voltage appearing at the voltage control line VBL. The fifth through seventh switches 231 through 233 may be formed using NMOS transistors or using any other suitable technology. Additionally, a capacitor 234 is interposed between the voltage control line VBL, at node N2, and a terminal of the ground voltage Vss, stabilizing a voltage of the voltage control line VBL.

The first through third latch circuits 240, 250 and 260 are coupled in parallel between the sensing node S0 and a ninth node N9.

The first latch circuit 240 includes an eighth switch 241 coupled between the sensing node S0 and a fourth node N4. The eighth switch 241 operates in response to a first transmission signal TRANC. Between the fourth node N4 and a third node N3 is coupled a latch that is formed of inverters 242 and 243. The latch of the first latch circuit 240 receives first data QC_N. Further, a ninth switch 244 is coupled between the third node N3 and a ninth node N9 and a tenth switch 245 is coupled between the fourth node N4 and the ninth node N9.

The second latch circuit 250 includes an eleventh switch 251 coupled between the sensing node S0 and a sixth node N6. The eleventh switch 251 operates in response to a second transmission signal TRANM. Between the sixth node N6 and a fifth node N5 is coupled a latch that is formed of inverters 252 and 253. The latch of the second latch circuit 250 receives second data QM_N. Further, a twelfth switch 254 is coupled between the fifth node N5 and the ninth node N9 and a thirteenth switch 255 is coupled between the sixth node N6 and the ninth node N9.

The third latch circuit 260 includes a fourteenth switch 261 coupled between the sensing node S0 and an eighth node N8. The fourteenth switch 261 operates in response to a third transmission signal TRANF. Between the eighth node N8 and a seventh node N7 is coupled a latch that is formed of inverters 262 and 263. The latch of the third latch circuit 260 receives third data QF_N. Further, a fifteenth switch 264 is coupled between the seventh node N7 and the ninth node N9 and a sixteenth switch 265 is coupled between the eighth node N8 and the ninth node N9.

Additionally, a seventeenth switch 201 is interposed between the first node N1 and the sensing node S0. Between the ninth node N9 and a terminal of the ground voltage Vss is coupled an eighteenth switch 203. The seventeenth switch 201 operates in response to a sensing signal PBSENSE and the eighteenth switch 203 operates in response to a voltage that is applied to the sensing node S0. The seventeenth and eighteenth switches 201 and 203 may be formed using NMOS transistors or using any other suitable technology.

A capacitor 202 is further coupled between the ground voltage Vss and the sensing node S0 between the first and second latch circuits 240 and 250, stabilizing a voltage of the sensing node S0.

The programming operation of the embodiments may be best understood with reference to the drawings as further described below.

Figure 5:
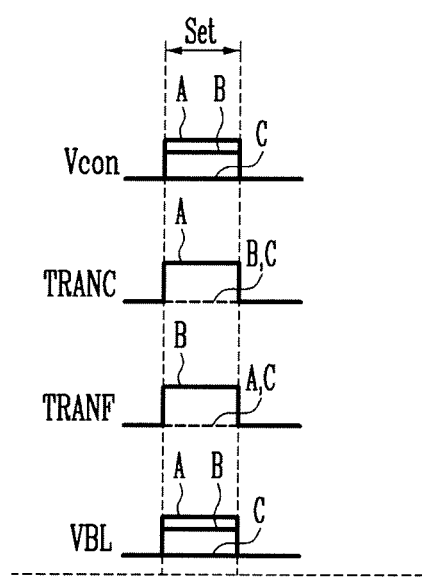
FIG. 5 is a timing diagram showing a procedure of setting a voltage on a sensing node according to embodiments of the present disclosure.

FIG. 5 shows a procedure of setting a voltage on a sensing node according to the embodiments.

Referring to FIGS. 4 and 5, memory cells are differently programmed into the first state PV1, the second state PV2 and the third state PV3 at the same time, as follows.

First, before setting a voltage at the sensing node S0, the first through third data QC_N, QM_N and QF_N, which are used for programming the memory cells into the first through third states PV1 through PV3, are input into the first, second and third latch circuits 240, 250 and 260, respectively. These data can be input through the ninth and tenth switches 244 and 245, the twelfth and thirteenth switches 254 and 255, and the fifteenth and sixteenth switches 264 and 265.

In detail, the data QC_N, QM_N and QF_N stored in the page buffer 200 are sequentially input as "111" if the selected memory cells are to be erased, "100" if the selected memory cells are to be programmed into the first state PV1, "001" if the selected memory cells are to be programmed into the second state PV2, or "000" if the selected memory cells are to be programmed into the third state PV3. After inputting those data into the latch circuits 240, 250 and 260, a voltage of the sensing node S0 is set as follows.

As illustrated in FIG. 5, there is a setting period "Set" for a voltage of the sensing node S0.

In case of programming a selected memory cell into the first state PV1 (A), the voltage generator 300 outputs the first control signal Vcon of a voltage level Va to turn the seventh switch 233 on during the setting period Set. The voltage level Va may be set on the sum of a first reference voltage V1 and two times a threshold voltage (Vth) of the seventh switch 233. That is, Va=V1+2Vth. The first transmission signal TRANC is generated at a logical high level to turn the eighth switch 241 on. During this, the second and third transmission signals TRANM and TRANF are generated at logical low levels. If the seventh and eighth switches 233 and 241 are turned on, a voltage corresponding to the first data QC_N is transferred to the voltage control line VBL. Thus, a voltage supplied into the voltage control line VBL, Va', becomes V1+Vth that is reduced by a threshold voltage (Vth) of the seventh switch 233 from Va.

In case of programming a selected memory cell into the second state PV2 (B), the voltage generator 300 outputs the first control signal Vcon of a voltage level Vb to turn the seventh switch 233 on during the setting period Set. This voltage level Vb is lower than Va but higher than 0V. The voltage level Vb may be set on the sum of a second reference voltage V2 and two times the threshold voltage (Vth) of the seventh switch 233. That is, Vb=V2+2Vth. The third transmission signal TRANF is generated at a logical high level to turn the fourteenth switch 261 on. During this, the first and second transmission signals TRANC and TRANM are generated at logical low levels. If the seventh and fourteenth switches 233 and 261 are turned on, the third data QF_N is transferred to the voltage control line VBL. Thus, a voltage supplied into the voltage control line VBL, Vb', becomes V2+Vth that is reduced by a threshold voltage (Vth) of the seventh switch 233 from Vb.

In case of programming a selected memory cell into the third state PV3 (C), the voltage generator 300 outputs the first control signal Vcon at a low level to turn the seventh switch 233 on during the setting period Set. The first through third transmission signals TRANC, TRANM and TRANF are generated at logical high levels to turn the eighth switch 241, the eleventh switch 251 and the fourteenth switch 261 off respectively. In other words, there is no supply of a high level voltage to the bit line BLe or BLo in programming the third state PV3 (C).

As stated above, the sensing node S0 of the different page buffers 200 is conditioned in various voltage levels corresponding to the states to be programmed. In summary, a voltage level of the sensing node S0 corresponding to the first state PV1 is set higher than that corresponding to the second and third states (PV2 and PV3). Meanwhile, the second state PV2 is lower than the first state PV1, but higher than the third state PV3, in voltage level of the sensing node S0. A voltage level of the sensing node S0 corresponding to the third state PV3 may be set on the ground voltage (e.g., 0V).

Figure 6:
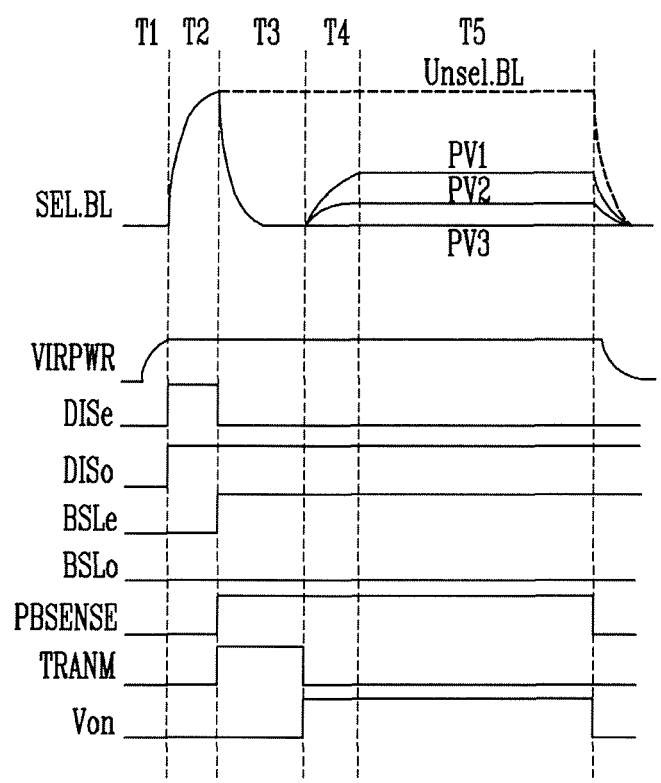
FIG. 6 is a timing diagram showing a programming operation according to embodiments of the present disclosure.

FIG. 6 shows a timing process of the programming operation according to the embodiments.

Referring to FIGS. 4 and 6, programming operation of the embodiments will be further described in relation to time.

The programming operation is composed by including a voltage supply period T1, a precharge period T2, a bit-line selection period T3, a program voltage supply period T4 and a program period T5. Although there is a program-verify period subsequent to the program period T5, it will not be discussed in the following description.

First, in the voltage supply period T1, the virtual voltage VIRPWR is supplied into the bit line selector 210.

In the precharge period T2, the even or odd selection signal, DISe or DISo, are activated to select the even or odd bit line BLe or BLo. For instance, if the even bit line BLe is electrically connected to a memory cell to be programmed, the even bit-line signal BSLe is generated at a logical high level and the odd bit-line signal BSLo is generated in at logical low level. Accordingly, the odd bit line BLo that is unselected (Unsel. BL) stays at a precharged level while the even bit line BLe that is selected is discharged according to the second data QM_N which is stored in the second latch circuit 250. Therefore the precharged level on the unselected bit line may be considered a program inhibition voltage. If a selected memory cell is to be held in the erased state, the second data QM_N is set to "1" and the even bit line BLe is not discharged. Discharging of the selected even bit line BLe may occur in a programming operation corresponding to one of the first through third states PV1 through PV3.

In the program-voltage supply period T4, the second control signal Von is generated in a logical high level. Then, the fifth switch 231 is turned on and a voltage of the sensing node S0 is determined by a voltage level applied to the voltage control line VBL. Thereby, it changes a voltage level at the selected even bit line BLe.

In the program period T5, the programming operation practically begins by applying turn-on voltages to the drain selection line DSL and the source selection line SSL, applying a program voltage to a selected word line, and applying a program pass voltage to the rest of the unselected word lines. In particular, the program voltage applied to the selected word line corresponds to the third state PV3 regardless of a state to be programmed. During this, a selected memory cell is variously programmed into the states according to a voltage level applied to the selected even bit line BLe. As an example, for a memory cell to be programmed into the first state PV1, the first bit-line voltage applied to the bit line BLe enables the memory cell to be programmed into the first state PV1 even when the program voltage of the third state PV3 is applied to the selected word line. For a memory cell to be programmed into the second state PV2, the second bit-line voltage applied to the bit line BLe enables the memory cell to be programmed into the second state PV2 even when the program voltage of the third state PV3 is applied to the selected word line. Here, the second bit-line voltage is lower than the first bit-line voltage. For a memory cell to be programmed into the third state PV3, the third bit-line voltage is applied to the bit line BLe. The third bit-line voltage may be lower than the second bit-line voltage or set on 0V, making the memory cell programmed into the third state PV3. As a result, it is possible to program erased memory cells at the same time regardless of programming operations with the lowest and highest bits.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope as defined in the claims.

What is claimed is:

1. A programming method comprising:
classifying memory cells to be programmed into a first state, a second state and a third state;
applying a program inhibition voltage to unselected bit lines, applying a first bit line voltage lower than the program inhibition voltage to bit lines coupled to memory cells that are to be programmed into the first state, applying a second bit line voltage lower than the first bit line voltage to bit lines coupled to memory cells that are to be programmed into the second state, and applying a third bit line voltage lower than the second bit line voltage to bit lines coupled to memory cells that are to be programmed into the third state; and
applying a program voltage to a selected word line associated with the memory cells to be programmed into the first to third states.

2. The programming method according to claim 1, wherein the program voltage is set to program memory cells in the third state.

3. The programming method according to claim 1, wherein classifying the memory cells to be programmed into the first state, the second state and the third state levels comprises:
inputting program data into page buffers coupled to the bit lines and classifying the states to program the memory cells in accordance with the program data.

4. The programming method according to claim 1, wherein a program pass voltage is applied to unselected word lines.

5. The programming method according to claim 1, wherein the program voltage that is applied to the selected word line is gradually increased.

6. A semiconductor memory device comprising:
strings each including a plurality of memory cells;
page buffer coupled to the strings through bit lines and configured to provide a program inhibition voltage, a first bit line voltage lower than the program inhibition voltage, a second bit line voltage lower than the first bit line voltage, or a third bit line voltage lower than the second bit line voltage to selected bit line in response to a first control signal; and
a voltage generator configured to generate the first control signal in accordance with program level of memory cell that is to be programmed.

7. The semiconductor memory device according to claim 6, wherein the page buffer comprises:
a bit line selector configured to couple a sensing node with a selected one of the bit lines;
a precharge circuit configured to transfer a precharge voltage to the sensing node;
a voltage controller configured to provide the program inhibition voltage, the first bit line voltage or the second bit line voltage to the sensing node in response to the first control signal; and
a latch circuit coupled with the sensing node and configured to receive data that is to be programmed.

8. The semiconductor memory device according to claim 7, wherein the voltage controller comprises:
two switches serially coupled between a terminal of a power source voltage and the sensing node; and
a third switch coupled between a gate line of one of the two switches and the sensing node.

9. The semiconductor memory device according to claim 8, wherein the third switch operates in compliance with the first control signal.

10. The semiconductor memory device according to claim 8, wherein the switches are made of NMOS transistors.

* * * * *